US006944068B2

(12) United States Patent
Quader et al.

(10) Patent No.: US 6,944,068 B2
(45) Date of Patent: *Sep. 13, 2005

(54) METHOD AND SYSTEM FOR PROGRAMMING AND INHIBITING MULTI-LEVEL, NON-VOLATILE MEMORY CELLS

(75) Inventors: Khandker N. Quader, Sunnyvale, CA (US); Khanh T. Nguyen, Sunnyvale, CA (US); Feng Pan, San Jose, CA (US); Long C. Pham, San Jose, CA (US); Alexander K. Mak, Los Altos Hills, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/809,571

(22) Filed: Mar. 24, 2004

(65) Prior Publication Data

US 2004/0179404 A1 Sep. 16, 2004

Related U.S. Application Data

(63) Continuation of application No. 10/025,749, filed on Dec. 18, 2001.

(51) Int. Cl.[7] ............................................... G11C 16/06
(52) U.S. Cl. ........................... 365/189.22; 365/185.03; 365/185.12; 365/185.24
(58) Field of Search ....................... 365/185.22, 185.03, 365/185.12, 185.24

(56) References Cited

U.S. PATENT DOCUMENTS

| | | | |
|---|---|---|---|
| 5,095,344 A | 3/1992 | Harari | 357/23.5 |
| 5,163,021 A | 11/1992 | Mehrotra et al. | 365/185 |
| 5,172,338 A | 12/1992 | Mehrotra et al. | 365/185 |
| 5,430,859 A | 7/1995 | Norman et al. | 395/425 |
| 5,570,315 A | 10/1996 | Tanaka et al. | 365/185.22 |
| 5,602,987 A | 2/1997 | Harari et al. | 395/182.06 |
| 5,657,332 A | 8/1997 | Auclair et al. | 371/40.11 |
| 5,663,901 A | 9/1997 | Wallace et al. | 365/52 |
| 5,712,180 A | 1/1998 | Guterman et al. | 437/43 |
| 5,768,191 A | 6/1998 | Choi et al. | |
| 5,774,397 A | 6/1998 | Endoh et al. | 365/185.19 |
| 5,890,192 A | 3/1999 | Lee et al. | 711/103 |
| 5,920,507 A | 7/1999 | Takeuchi et al. | |
| 5,920,509 A | 7/1999 | Hirano et al. | |
| 6,046,935 A | 4/2000 | Takeuchi et al. | 365/185.03 |
| 6,151,248 A | 11/2000 | Harari et al. | 365/185.14 |
| 6,278,632 B1 * | 8/2001 | Chevallier | 365/185.03 |
| 6,373,746 B1 | 4/2002 | Takeuchi et al. | |
| 6,411,551 B1 | 6/2002 | Kim et al. | |
| 6,426,893 B1 | 7/2002 | Conley et al. | |
| 6,456,528 B1 * | 9/2002 | Chen | 365/185.03 |
| 6,512,263 B1 | 1/2003 | Yuan et al. | |
| 6,522,580 B2 * | 2/2003 | Chen et al. | 365/185.02 |
| 6,538,923 B1 | 3/2003 | Parker | |

OTHER PUBLICATIONS

"Notification of Transmittal of the International Search Report or the Declaration," corresponding PCT Application No. PCT/US02/37972, PCT International Searching Authority, Apr. 10, 2003, 6 pages.

* cited by examiner

*Primary Examiner*—Anh Phung
*Assistant Examiner*—N Nguyen
(74) *Attorney, Agent, or Firm*—Parsons Hsue & De Runtz LLP

(57) ABSTRACT

A multi-level non-volatile memory cell programming/lockout method and system are provided. The programming/lockout method and system advantageously prevent memory cells that charge faster than other memory cells from being over-programmed.

18 Claims, 9 Drawing Sheets

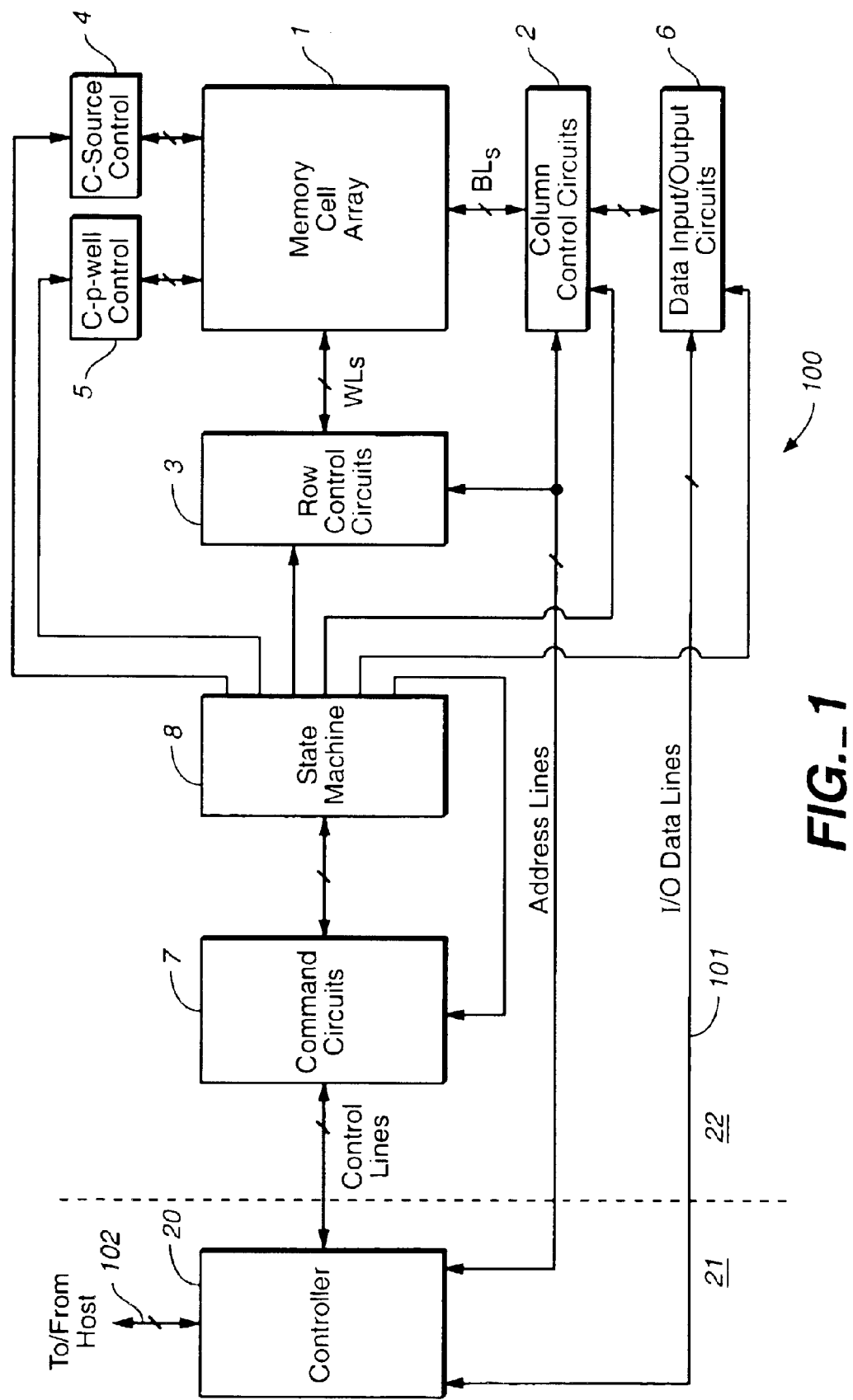
FIG._1

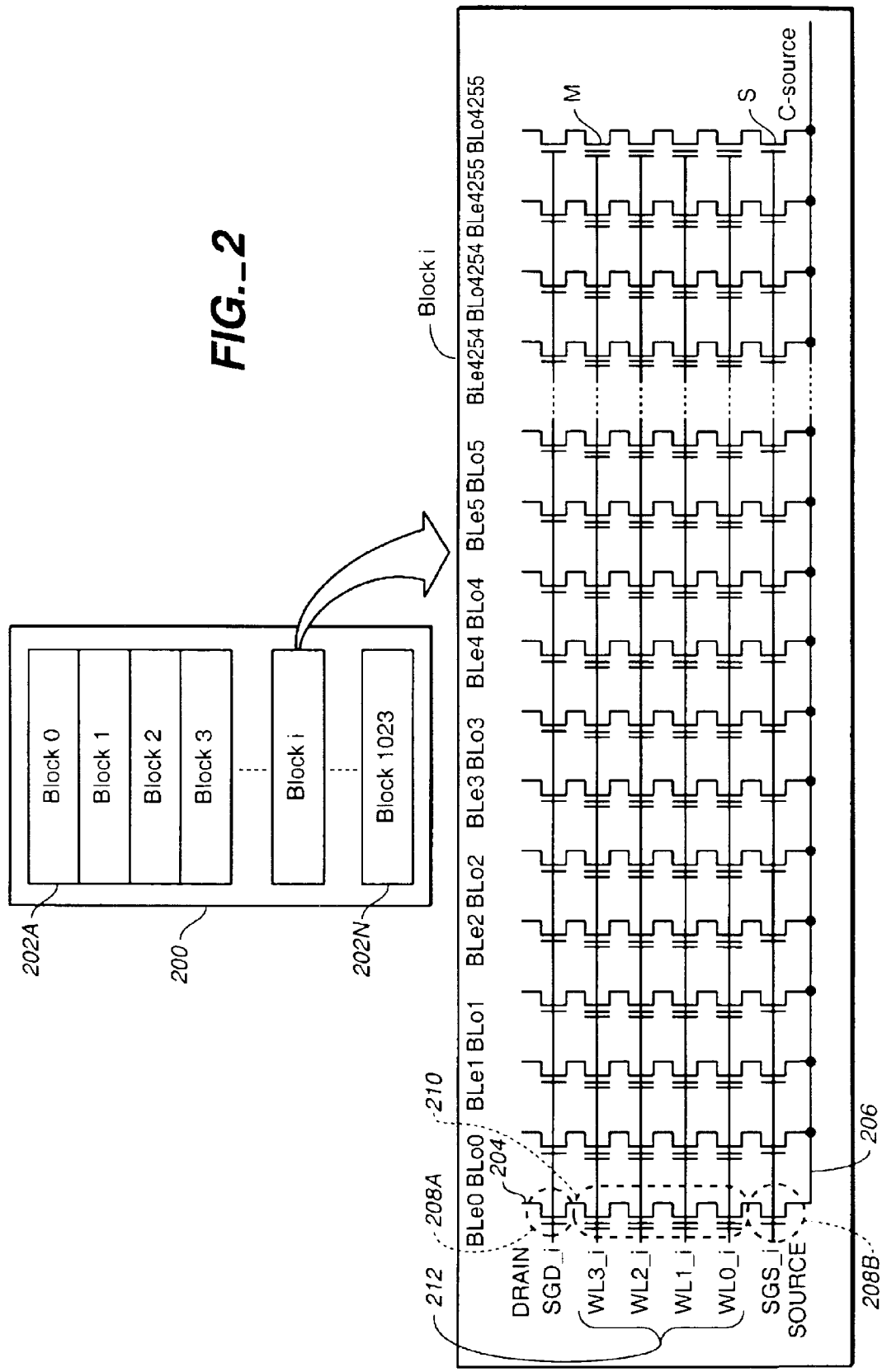
FIG._2

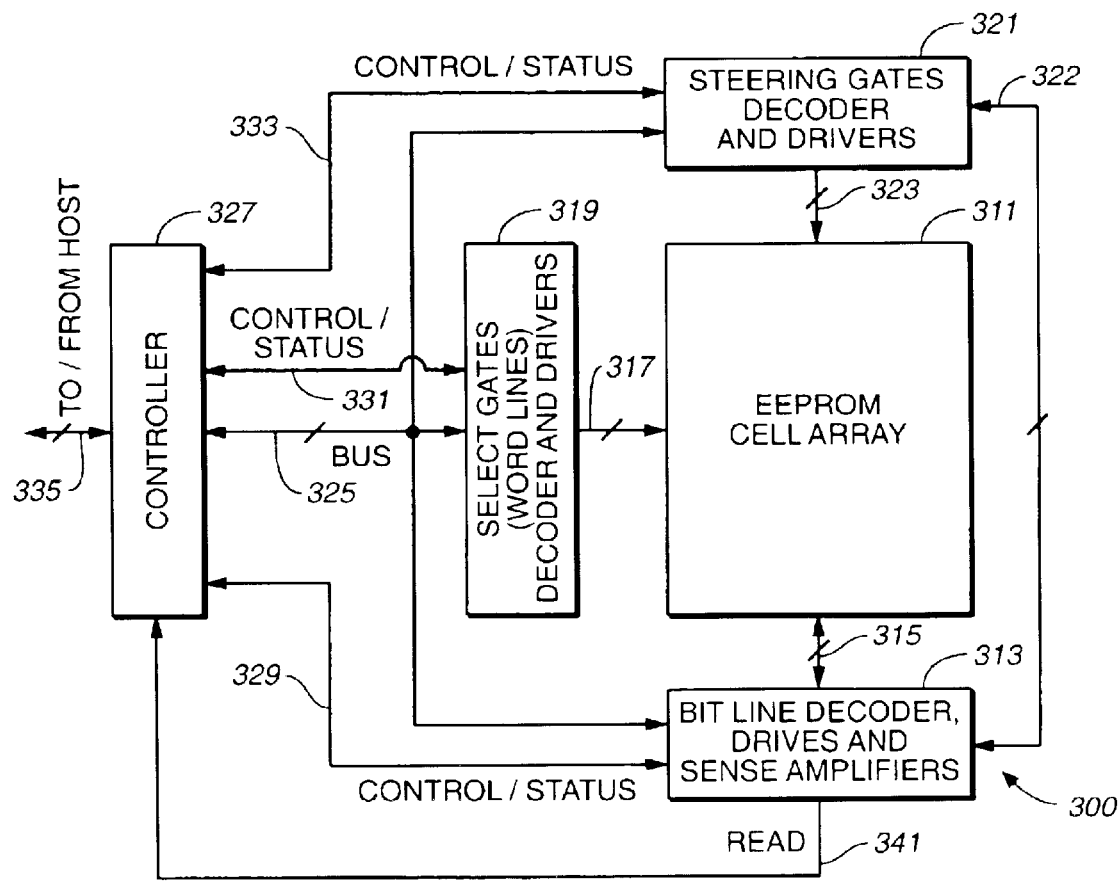
FIG._3

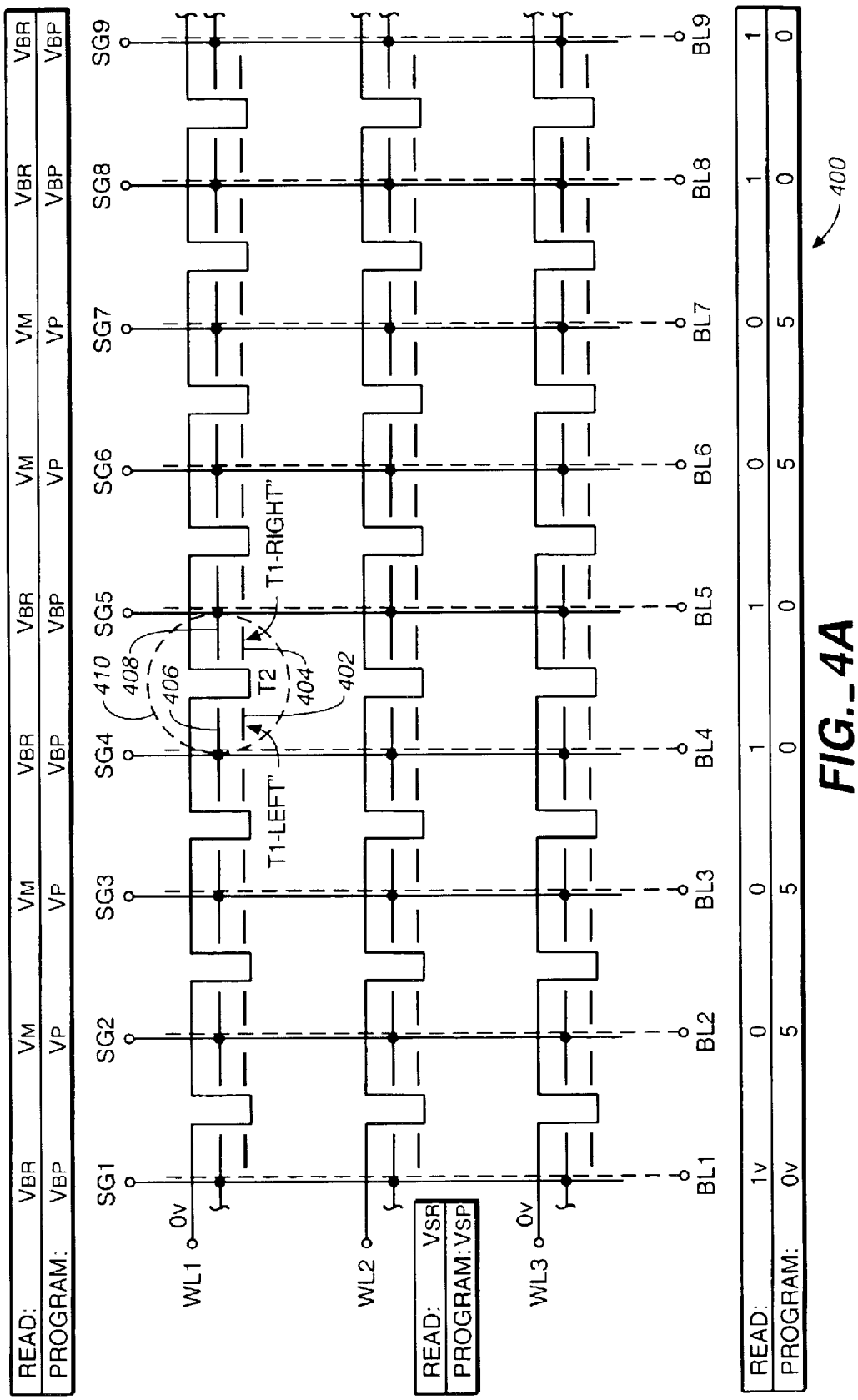
FIG._4A

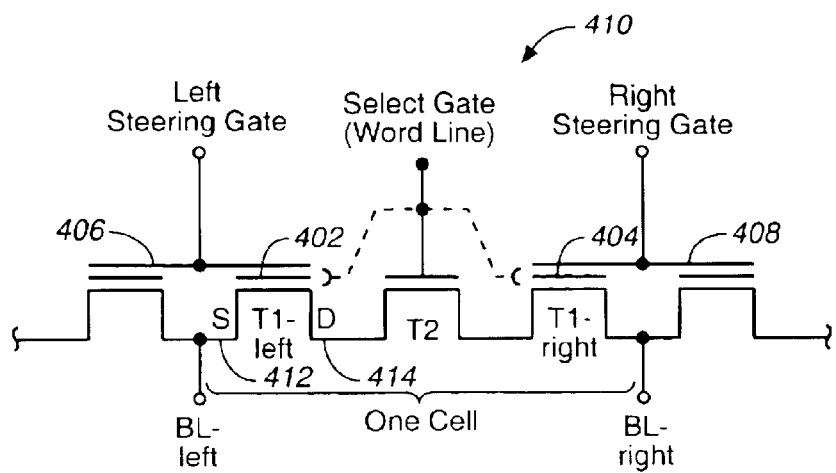
FIG._4B
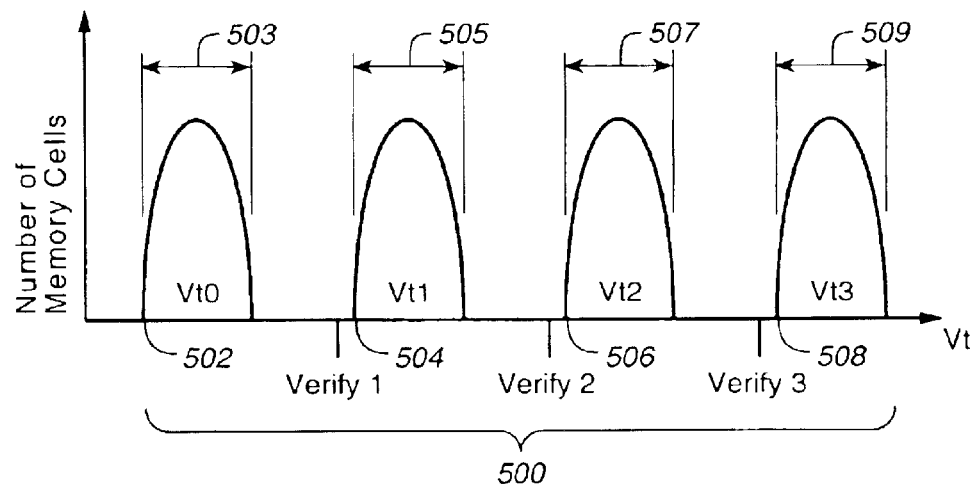
FIG._5
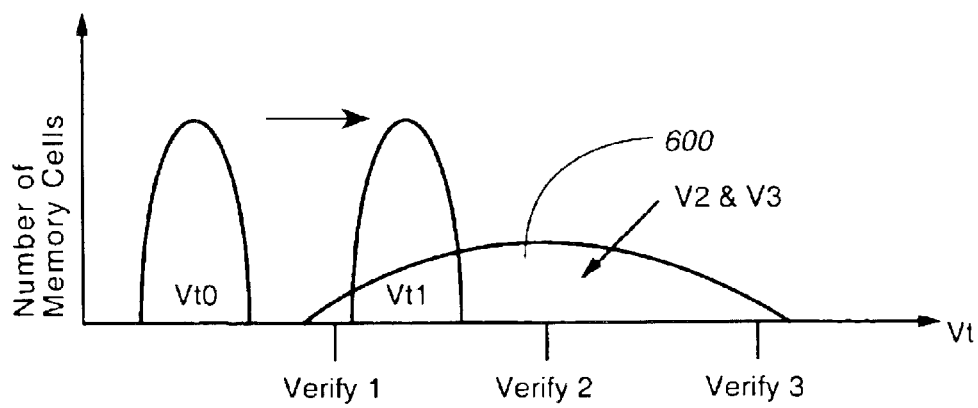
FIG._6

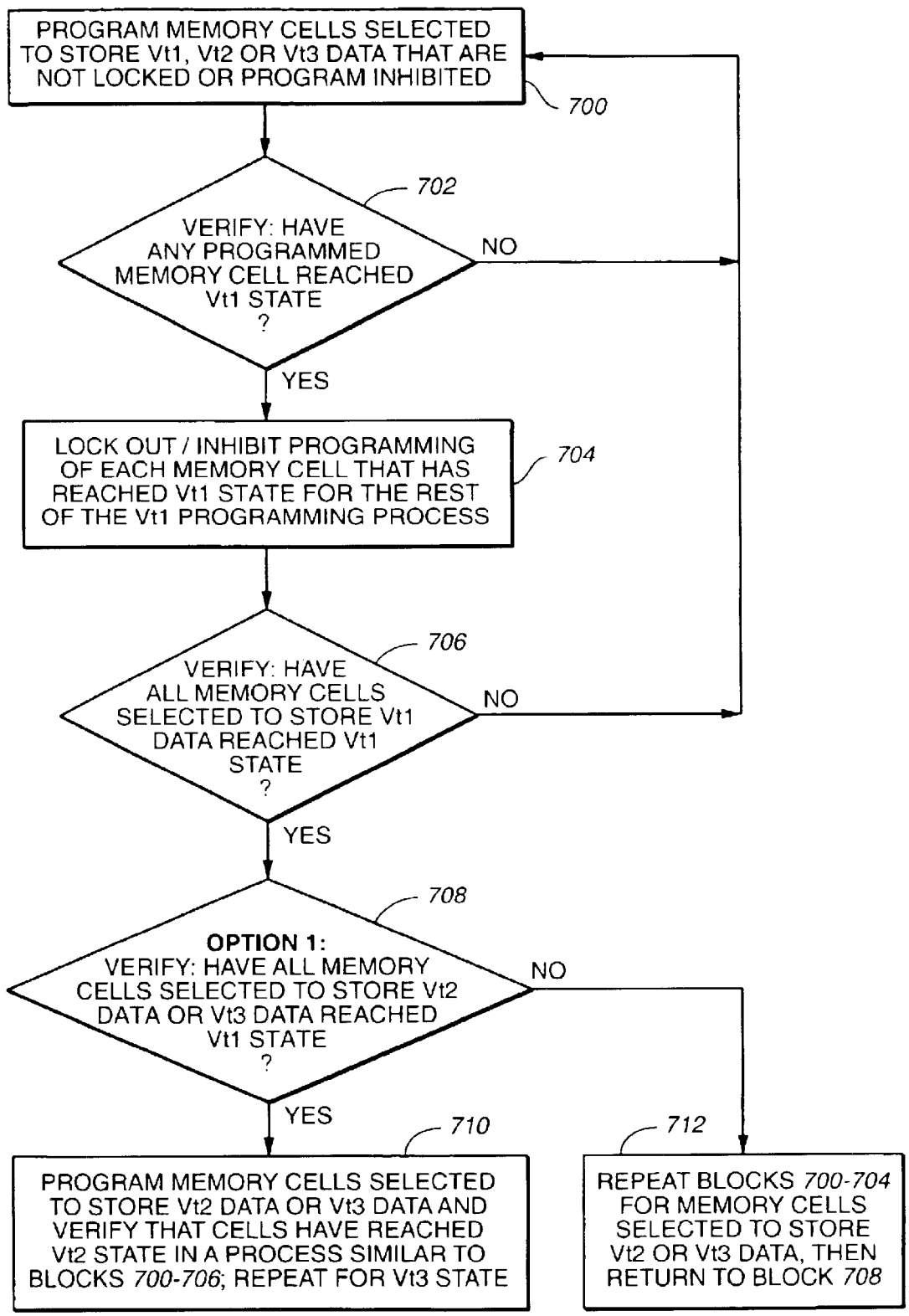
FIG._7

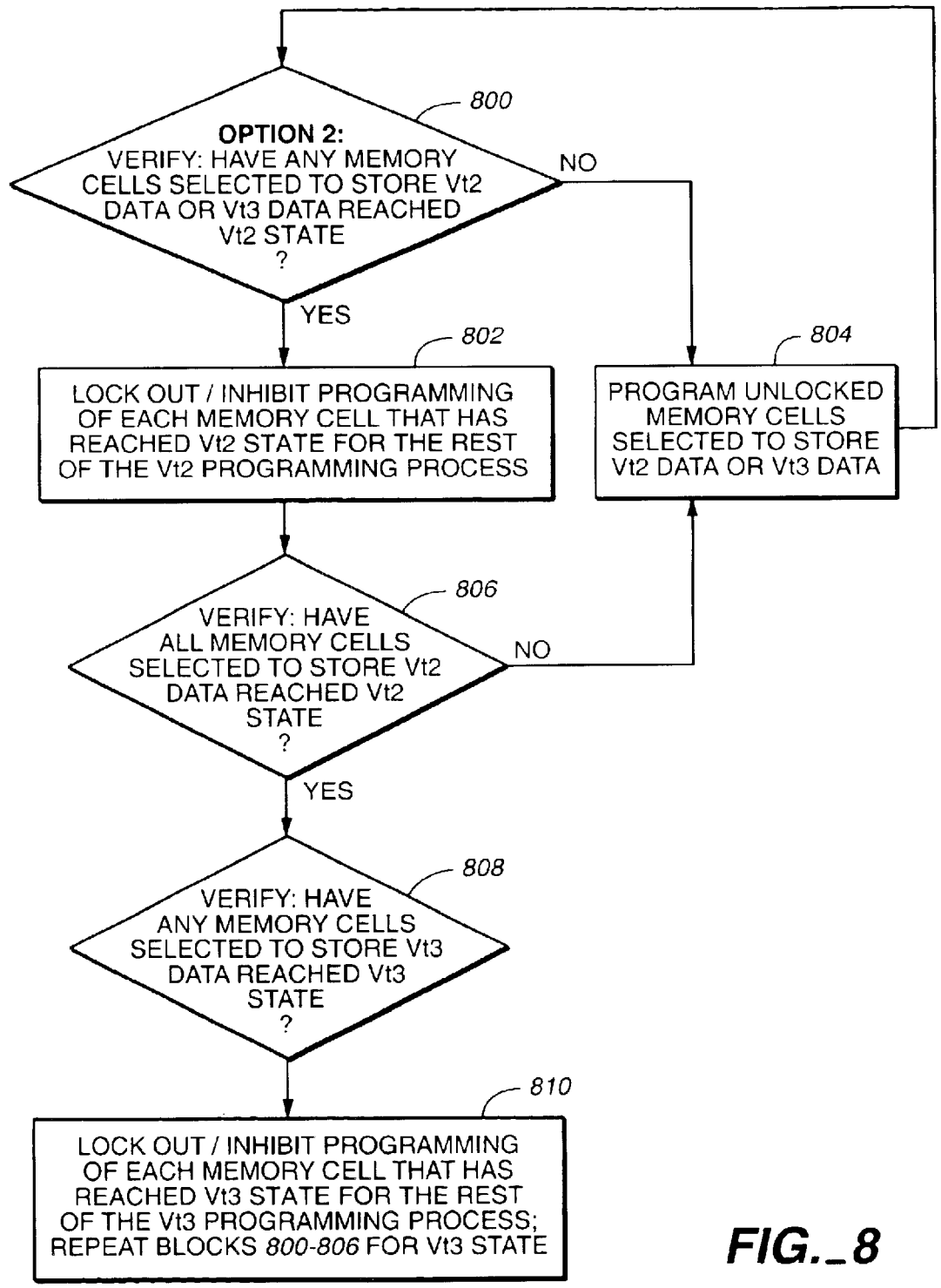
FIG._8

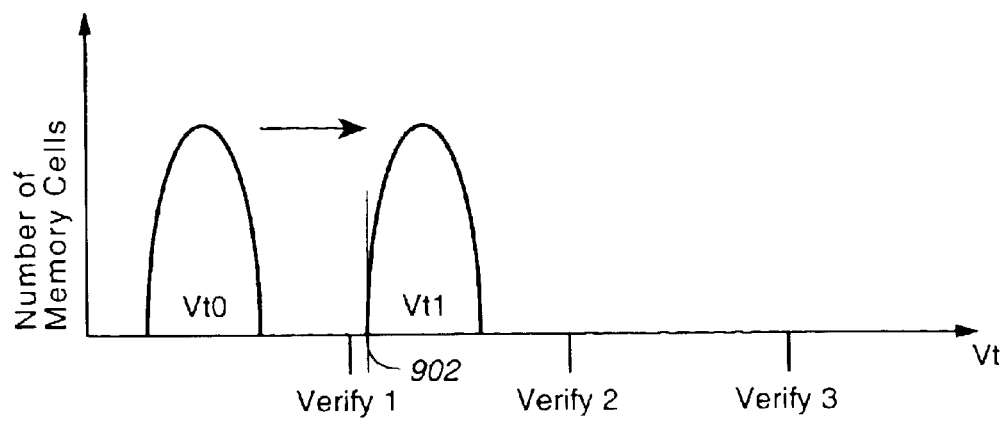
FIG._9
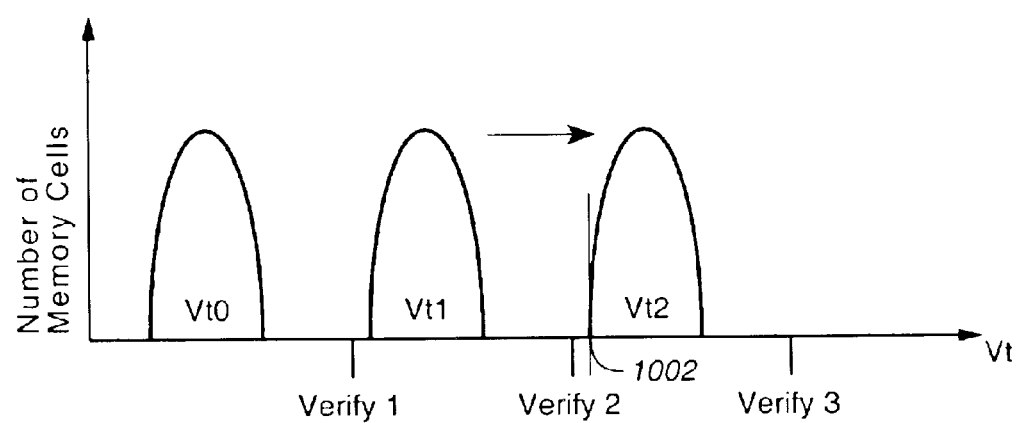
FIG._10
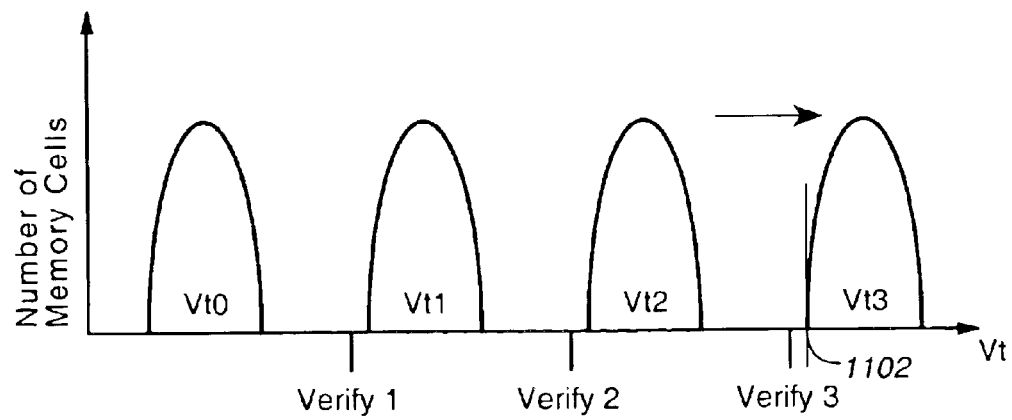
FIG._11

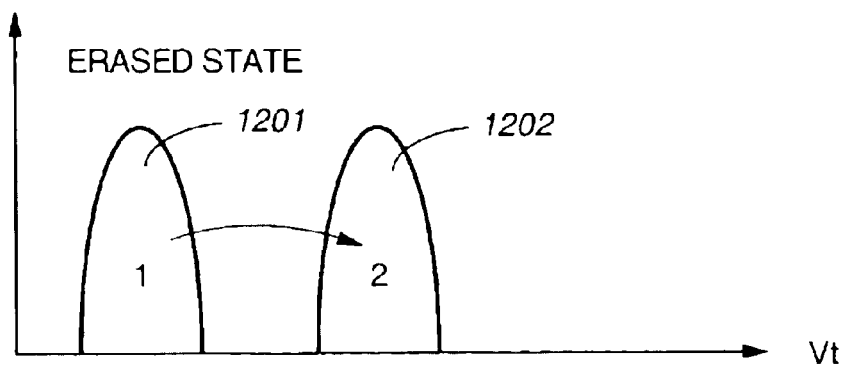
FIG._12A
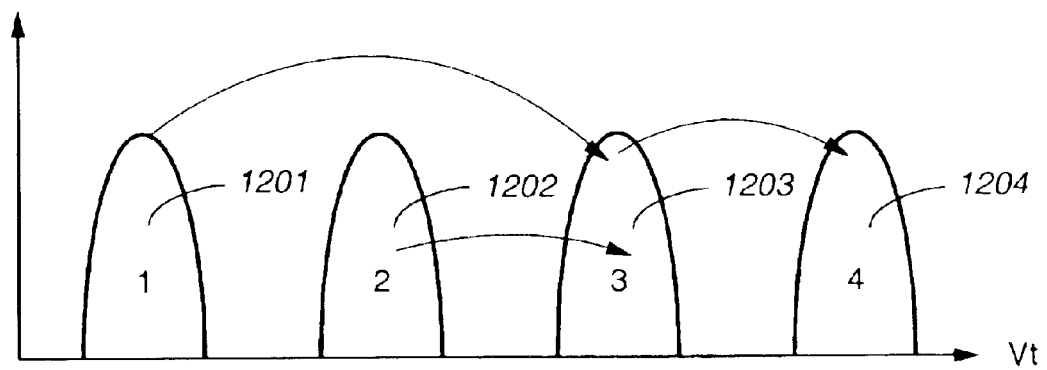
FIG._12B

METHOD AND SYSTEM FOR PROGRAMMING AND INHIBITING MULTI-LEVEL, NON-VOLATILE MEMORY CELLS

CROSS-REFERENCE TO RELATED APPLICATION

This application is a continuation of application Ser. No. 10/025,749, filed Dec. 18, 2001, which application is incorporated herein in its entirety by this reference.

FIELD OF THE INVENTION

The present invention relates to non-volatile memories, and more specifically, to a method and system for programming and inhibiting multi-level, non-volatile memory cells.

BACKGROUND OF THE INVENTION

Non-volatile memories are configured to store data. A flash electrically-erasable, programmable read only memory (EEPROM) is one type of non-volatile memory. A flash EEPROM may comprise an array of memory cells, arranged in columns and rows. Each memory cell may comprise a transistor with a floating gate or a dielectric layer configured to store at least two charge levels.

SUMMARY OF THE INVENTION

A method and system for programming and inhibiting multi-level, non-volatile memory cells are provided in accordance with the present invention. The programming/inhibiting method and system advantageously prevents memory cells that charge faster than other memory cells from being over-programmed.

One aspect of the invention relates to a method of programming a plurality of non-volatile memory cells to have a plurality of threshold voltage levels. The method comprises programming the memory cells with at least one voltage pulse. After at least one voltage pulse, the method continues programming if no memory cell has reached or exceeded a first predetermined threshold voltage level. The first predetermined threshold voltage level represents a first set of data bits. The method inhibits programming of any memory cell that has reached or exceeded the first predetermined threshold voltage level. The method determines whether all memory cells selected to store the first set of data bits have reached or exceeded the first predetermined threshold voltage level. If at least one memory cell selected to store the first set of data bits has not reached or exceeded the first predetermined threshold voltage level, the method continues programming of uninhibited memory cells. If all memory cells selected to store the first set of data bits have reached or exceeded the first predetermined threshold voltage level, the method determines whether all memory cells selected to store second or third sets of data bits have reached or exceeded the first predetermined threshold voltage level. If at least one memory cell selected to store second or third sets of data bits has not reached or exceeded the first predetermined threshold voltage level, the method continues programming uninhibited memory cells until all memory cells selected to store second or third sets of data bits have reached or exceeded the first predetermined threshold voltage level. If all memory cells selected to store second or third sets of data bits have reached or exceeded the first predetermined threshold voltage level, the method continues programming all memory cells selected to store second or third sets of data bits.

Another aspect of the invention relates to a method of programming a plurality of non-volatile memory cells. The memory cells comprise a first set of one or more memory cells selected to store a charge level equal to or greater than a first predetermined charge level corresponding to a first set of data bits, a second set of one or more memory cells selected to store a charge level equal to or greater than a second predetermined charge level corresponding to a second set of data bits and a third set of one or more memory cells selected to store a charge level equal to or greater than a third predetermined charge level corresponding to a third set of data bits. The method comprises simultaneously storing charge in the first, second and third sets of memory cells to store charge in the memory cells. The method continues storing charge in the memory cells if no memory cell has reached or exceeded the first predetermined charge level. The method inhibits charging of any memory cell in the first, second and third sets that has reached or exceeded the first predetermined charge level. The method determines whether all memory cells in the first set have reached or exceeded the first predetermined charge level. If at least one memory cell in the first set has not reached or exceeded the first predetermined charge level, the method continues storing charge in uninhibited memory cells.

Another aspect of the invention relates to a method of programming a plurality of non-volatile memory cells to have a plurality of threshold voltage levels. The method comprises programming the memory cells with at least one voltage pulse. After at least one voltage pulse, the method continues programming if no memory cell has reached or exceeded a first predetermined threshold voltage level. The first predetermined threshold voltage level represents a first set of data bits. The method inhibits programming of any memory cell that has reached or exceeded the first predetermined threshold voltage level. The method determines whether all memory cells selected to store the first set of data bits have reached or exceeded the first predetermined threshold voltage level. If at least one memory cell selected to store the first set of data bits has not reached or exceeded the first predetermined threshold voltage level, the method continues programming of uninhibited memory cells. If all memory cells selected to store the first set of data bits have reached or exceeded the first predetermined threshold voltage level, the method determines whether any memory cell has reached or exceeded a second predetermined threshold voltage level. The second predetermined threshold voltage level represents a second set of data bits. The method inhibits programming of any memory cell that has reached or exceeded the second predetermined threshold voltage level and continues programming of uninhibited memory cells.

Another aspect of the invention relates to a memory device comprising a plurality of non-volatile memory cells. The memory cells comprise a first set of one or more memory cells selected to store a charge equal to or greater than a first predetermined charge level corresponding to a first set of data bits; and a second set of one or more memory cells selected to store a charge equal to or greater than a second predetermined charge level corresponding to a second set of data bits. The memory device is configured to simultaneously program the first and second sets of memory cells and inhibit programming of any memory cell that reaches or exceeds the first predetermined charge level until all memory cells in the first set have reached or exceeded the first predetermined charge level.

Another aspect of the invention relates to a method of programming a plurality of non-volatile memory cells. The method comprises storing charge in a first set and a second set of memory cells; continuing storing charge in the memory cells if no memory cell has reached or exceeded a first predetermined charge level, the first predetermined charge level representing at least two data bits; inhibiting storing charge in any memory cell that has reached or exceeded the first predetermined charge level; determining whether all memory cells in the first set of memory cells have reached or exceeded the first predetermined charge level; if at least one memory cell in the first set has not reached or exceeded the first predetermined charge level, continuing storing charge in uninhibited memory cells; and if all memory cells in the first set have reached or exceeded the first predetermined charge level, continuing storing charge in the first set of memory cells.

Another aspect of the invention relates to a method of programming a plurality of non-volatile memory cells in parallel from a common threshold level into at least first and second threshold levels as designated by data being stored in the memory cells. The method comprises applying programming conditions to all of the plurality of memory cells designated for the first and second threshold levels; terminating application of the programming conditions to individual ones of the plurality of memory cells designated for the first and second threshold levels as the cells designated for the first and second threshold levels individually reach said first threshold level; after those of the memory cells designated for the first threshold level have all reached the first threshold level, applying programming conditions to those of the plurality of memory cells designated for the second threshold level; and terminating application of the programming conditions to individual ones of the plurality of memory cells designated for the second threshold level as the cells designated for the second threshold level individually reach said second threshold level.

BRIEF DESCRIPTION OF THE DRAWINGS

FIG. 1 illustrates one embodiment of a non-volatile memory system in which the various aspects of the present invention may be implemented.

FIG. 2 illustrates one embodiment of a NAND-type flash EEPROM memory cell array that may be implemented in the system of FIG. 1.

FIG. 3 illustrates another embodiment of a non-volatile memory system in which the various aspects of the present invention may be implemented.

FIG. 4A illustrates a part of one embodiment of a NOR-type flash EEPROM memory cell array that may be implemented in the system of FIG. 3.

FIG. 4B illustrates one embodiment of a NOR-type flash EEPROM memory cell that may be implemented in the system of FIG. 3.

FIG. 5 illustrates distributions of memory cells in the memory array in FIG. 1 or the memory array in FIG. 3 that are programmed to a plurality of threshold voltage storage states.

FIG. 6 illustrates distributions of memory cells in the memory array in FIG. 1 or the memory array in FIG. 3 that are programmed to a plurality of threshold voltage storage states, including fast bits in Vt2 and Vt3 state distributions.

FIG. 7 illustrates one embodiment of a method of programming, verifying and locking out a plurality of memory cells in the memory array of FIG. 1 or the memory array in FIG. 3.

FIG. 8 illustrates another embodiment of a method of programming, verifying and locking out a plurality of memory cells in the memory array of FIG. 1 or the memory array in FIG. 3.

FIG. 9 illustrates distributions of memory cells in the memory array in FIG. 1 or the memory array in FIG. 3 that are programmed to a threshold voltage Vt1 storage state with no over-programmed memory cells.

FIG. 10 illustrates distributions of memory cells in the memory array in FIG. 1 or the memory array in FIG. 3 that are programmed to threshold voltage Vt1 and Vt2 storage states with no over-programmed bits.

FIG. 11 illustrates distributions of memory cells in the memory array in FIG. 1 or the memory array in FIG. 3 that are programmed to threshold voltage Vt1, Vt2 and Vt3 storage states with no over-programmed bits.

FIG. 12A illustrates distributions of memory cells in the memory array in FIG. 1 or the memory array in FIG. 3 after a first page programming process.

FIG. 12B illustrates distributions of memory cells in the memory array in FIG. 1 or the memory array in FIG. 3 after a second page programming process.

DETAILED DESCRIPTION

The principles of the present invention may be applied to various types of non-volatile memories that currently exist, such as an erasable programmable read-only memory (EPROM) or an electrically-erasable programmable read-only memory (EEPROM). The principles of the present invention may also be applied to various types of non-volatile memories that use new technologies. Implementations of the present invention are described herein with respect to a flash EEPROM, where each memory cell comprises at least one charged storage element, such as a transistor with a floating gate or a dielectric layer.

FIG. 1 illustrates one embodiment of a non-volatile memory system 100 in which the various aspects of the present invention may be implemented. The system 100 in FIG. 1 is described in co-assigned U.S. patent application Ser. No. 09/893,277, entitled "Operating Techniques For Reducing Effects Of Coupling Between Storage Elements Of A Non-Volatile Memory Operated In Multiple Data States", filed on Jun. 27, 2001, which is hereby incorporated by reference in its entirety.

A memory array 1 in FIG. 1 comprises a plurality of memory cells or memory elements (Ms) arranged in a row and column matrix. The memory cell array 1 is controlled by a column control circuit 2, a row control circuit 3, a c-source control circuit 4 and a c-p-well control circuit 5.

The column control circuit 2 in FIG. 1 is coupled to bit lines (BLs) of the memory cell array 1. The column control circuit 2 controls potential levels of the bit lines (BLs), i.e., to apply programming or inhibit programming, to determine states of the memory cells (Ms) during a program operation, and to read data stored in the memory cells (Ms).

The row control circuit 3 in FIG. 1 is coupled to word lines (WLs) to select one of the word lines (WLs), to apply program voltages combined with the bit line potential levels controlled by the column control circuit 2, to apply read voltages, and to apply an erase voltage. The erase voltage may be coupled with a voltage of a p-type region ("c-p-well") on which the memory cells (Ms) are formed.

The c-source control circuit 4 in FIG. 1 controls a common source line (labeled as "c-source" in FIG. 3) connected to the memory cells (Ms). The c-p-well control circuit 5 controls a c-p-well voltage.

The column control circuit 2 may read out data stored in the memory cells (Ms) of the array 1 and output the data to external I/O lines 101 via a data input/output buffer 6. The external I/O lines 101 are connected to a controller 20. The external I/O lines 101 may transfer program data to be stored in the memory cells to the data input/output buffer 6, which transfers the data to the column control circuit 2.

Command data for controlling the flash memory device 100 may be input to a command interface (not shown) coupled to external control lines 102, which are coupled to the controller 20. The command data may inform the memory system 100 of a requested operation. The controller 20 transfers the input command to a state machine 8, which controls the column control circuit 2 the row control circuit 3, the c-source control circuit 4, the c-p-well control circuit 5 and the data input/output buffer 6. The state machine 8 can output a status data of the flash memory such as READY/BUSY or PASS/FAIL.

The controller 20 in FIG. 1 is connected or connectable with a host system (not shown) such as a personal computer, a digital camera or a personal digital assistant (PDA). The host system initiates commands, such as store and read data, to and from the memory array 1, and provides and receives such data, respectively. The controller 20 converts such commands into command signals that can be interpreted and executed by the command circuits 7. The controller 20 may contain buffer memory for the user data being written to or read from the memory array 1.

As shown in FIG. 1, a memory system 100 may include an integrated circuit chip 21 that includes the controller 20, and one or more integrated circuit chips 22 that each contain a memory array 1 and associated control, command, input/output and state machine circuits 2, 3, 4, 5, 6, 7, 8. In another embodiment, the controller 20 (and possibly other control circuits) and one or more memory arrays 1 are integrated together on one or more integrated circuit chips. The memory system 100 may be embedded as part of the host system, or may be included in a memory card that is removably insertable into a mating socket of a host system. Such a card may include the entire memory system 100, or the controller 20 and memory array 1, with associated peripheral circuits. In another embodiment, the associated peripheral circuits may be provided in separate cards.

The memory cell array 1 in FIG. 1 may comprise any number of memory cells. The memory cell array 1 may be structured as one or more types of flash EEPROM cell arrays, such as NAND-type or NOR-type arrays. Examples of NAND-type or NOR-type arrays are described in co-assigned U.S. Pat. No. 6,151,248, entitled "Dual Floating Gate EEPROM Cell Array With Steering Gates Shared By Adjacent Cells," U.S. patent application Ser. No. 09/893,277 and U.S. Pat. No. 6,046,935, entitled "Semiconductor. Device And Memory System," assigned to Toshiba, which are hereby incorporated by reference in their entireties. Some examples of flash EEPROM cell arrays are described below.

NAND-Type Memory Array

FIG. 2 illustrates one embodiment of a NAND-type flash EEPROM memory cell array 200 that may be implemented in the system 100 of FIG. 1. The array 200 comprises a plurality of blocks 202A–202N. Each block 202 comprises a plurality of pages of memory cells. For example, a block 202 may comprise 8 or 16 pages of memory cells. In one embodiment, a "block" is the smallest unit of cells that may be simultaneously erased, and a "page" is the smallest unit of cells that may be simultaneously programmed.

A page in FIG. 2 may comprise a row of memory cells coupled to a word line, such as word line WL2, and particular bit lines, such as even bit lines Ble0–Ble4255.

Each column in a block 202 may comprise a group or "string" 210 of memory cells, such as 4, 8, 16 or 32 cells, connected in series between a bit line 204 and a reference potential line 206 via select transistors 208A, 208B at either end. The array 200 in FIG. 2 may comprise any number of cells. Word lines 212 are coupled to control gates of cells in several series strings, as shown in FIG. 2.

An example of a NAND-type array is further described in U.S. patent application Ser. No. 09/893,277, which has been incorporated by reference. Other examples of such NAND-type arrays are described in U.S. Pat. Nos. 5,570,315, 5,774,397 and 6,046,935, and U.S. patent application Ser. No. 09/667,610, assigned to Toshiba, which are hereby incorporated by reference in their entireties.

NOR-Type Memory Array

FIG. 3 illustrates another embodiment of a non-volatile memory system 300 in which the various aspects of the present invention may be implemented. The system 300 in FIG. 3 is described in U.S. Pat. No. 6,151,248, which has been incorporated by reference. The system 300 comprises a memory array 311, among other components.

FIG. 4A illustrates a part 400 of one embodiment of a NOR-type flash EEPROM memory cell array that may be implemented in the system 300 of FIG. 3. The array part 400 comprises a plurality of memory cells, such as the memory cell 408 connected between adjacent bit lines (BLs) (columns) BL4 and BL5 and a select transistor connected to a word line (row) WL1. Although a particular number of memory cells are shown in FIG. 4A as an example, the array part 400 may comprise any number of cells. The cells may be organized in blocks and/or pages.

FIG. 4B illustrates one embodiment of a NOR-type flash EEPROM memory cell 408 that may be implemented in the system 300 of FIG. 3. Each cell 408 comprises two transistors T1-left, T1-right with floating gates 402, 404 and a select transistor T2 between the two floating gate transistors.

Examples of NOR-type arrays and their use in storage systems are described in U.S. Pat. Nos. 5,095,344, 5,172,338, 5,602,987, 5,663,901, 5,430,859, 5,657,332, 5,712,180, 5,890,192, and 6,151,248, and U.S. patent application Ser. Nos. 09/505,555, filed Feb. 17, 2000, and 09/667,344, filed Sep. 22, 2000, assigned to SanDisk Corporation, which are hereby incorporated by reference in their entireties. Other examples of NOR-type arrays and their operation are described in U.S. Pat. No. 6,046,935, which has been incorporated by reference in its entirety.

Floating Gate Transistor and Programmable States

A floating gate transistor, such as the floating gate transistor T1-left in FIG. 4B, comprises a control gate terminal 406, a floating gate 402, a source terminal 412 and a drain terminal 414. Control circuits in FIG. 3 may apply a programming voltage to the transistor T1-left. After the programming voltage, the floating gate 402 is configured to store a charge level that falls within one of several of different charge level ranges. Examples of programming voltages are disclosed in U.S. patent application Ser. No. 09/893,277 and U.S. Pat. No. 6,046,935, which have been incorporated by reference.

Each charge level range corresponds to a range of threshold voltage levels, such as a range 503 in FIG. 5, which would cause the transistor T1-left (FIG. 4B) to "turn on," i.e., pass current between the source and drain terminals 412, 414, when a sufficient read or verify voltage is applied to the control gate 406. Thus, each range of threshold voltage levels defines a storage state, such as a "Vt0" state in FIG. 5.

FIG. 5 illustrates distributions (numbers) of memory cells in the memory array 1 in FIG. 1 or the memory array 311 in FIG. 3 that are programmed to a plurality of threshold voltage storage states, e.g., Vt0, Vt1, Vt2 and Vt3. Each storage state is defined by a range of threshold voltage levels. For example, the storage state Vt1 may be defined by threshold voltage range 505 with a minimum threshold voltage 504. The "Verify1" voltage in FIG. 5 may be set at the minimum threshold voltage 504 or offset by a small margin to account for non-ideal sensing conditions, such as noise.

If the floating gate 402 in FIG. 4B has two programmable threshold voltage ranges, i.e., two ranges of stored charge levels, such as ranges 503, 505 in FIG. 5, the floating gate transistor T1-left has two programmable states, such as the Vt0 and Vt1 states in FIG. 5. Thus, the transistor T1-left may store one binary bit of data, where the Vt0 state may correspond to a "1" data bit and the Vt1 state may correspond to a "0" data bit.

If the floating gate 402 in FIG. 4 has four programmable threshold voltage ranges, such as the ranges 503, 505, 507, 509 in FIG. 5, the floating gate transistor T1-left has four programmable states, such as the Vt0, Vt1, Vt2 and Vt3 states in FIG. 5. The transistor T1-left may store two binary bits of data, where the Vt0, Vt1, Vt2 and Vt3 states may correspond to "00," "01," "10," "11" in any configurable order. For example, the Vt0, Vt1, Vt2 and Vt3 states may correspond to "11," "10," "01," and "00," respectively. As another example, the Vt0, Vt1, Vt2 and Vt3 states may correspond to "00," "01," "10," and "11," respectively.

One way to minimize the size of the memory system 100 in FIG. 1 is to shrink the size of the memory array 1. One solution is to increase the data storage density of the memory array 1 by storing more than one bit of data in each floating gate transistor. A floating gate transistor may be programmed to any number of storage states, such as 4, 8, 16 or 32 states. Each floating gate transistor may have a total range or window of threshold voltages in which the transistor may operate. For example, a total range 500 in FIG. 5 comprises ranges 503, 505, 507, 509 that define four states Vt0, Vt1, Vt2 and Vt3 for a particular transistor 400 plus margins between the ranges 503, 505, 507, 509 to allow the states to be clearly differentiated from one another.

Programming Multiple States

A multi-level non-volatile memory system, such as the system 100 in FIG. 1 or the system 300 in FIG. 3, typically erases a large number of selected memory cells organized as a "block" prior to programming or reprogramming. The system 100 then simultaneously programs selected cells in a "page" within the block from an erase state into individual states corresponding to incoming data to be stored in the memory array 1. In one embodiment, the system 100 is configured to simultaneously program more than 1000 cells, such as 4,256 cells.

In one embodiment, the system 100 alternately applies programming voltage pulses to selected memory cells in parallel and reads the states (i.e., verifying the threshold voltages) of the cells to determine whether individual cells have reached or exceeded their intended states. Examples of programming and verifying methods, including programming and verifying voltage levels, are described in U.S. patent application Ser. No. 09/893,277 and U.S. Pat. No. 6,046,935, which have been incorporated by reference.

The system 100 inhibits programming for any cell that is verified to have reached its intended minimum threshold voltage level, such as the minimum threshold level 504 in FIG. 5, by using a verify voltage, e.g., "Verify1 in FIG. 5. Programming of other cells in the page may continue until all cells in the page are sufficiently programmed.

For example, the non-volatile memory system 100 in FIG. 1 may program one or more pages of memory cells to various states, such as the Vt0, Vt1, Vt2 and Vt3 states in FIG. 5, according to a received data pattern of 1's and 0's. All multi-level memory cells in the page of the memory array 1 (FIG. 1) start with a completely erased state, such as Vt0 in one embodiment. In this embodiment, Vt0 is the lowest state in FIG. 5, and Vt3 is the highest state to be programmed. Memory cells selected to store data (e.g., 00) corresponding to the Vt0 state do not need program pulses and will be program inhibited. Memory cells selected to store data (e.g., 01, 10 and 11) corresponding to the Vt1, Vt2 and Vt3 states are programmed from the Vt0 state.

As used herein, programmed data associated with a particular Vt state may be referred to as "Vt data." For example, "01" data associated with a Vt1 state may be referred to as "Vt1 data."

Simultaneous Programming

In one embodiment, since memory cells selected to store Vt2 and Vt3 data need to be programmed to higher threshold voltage levels, the memory system 160 (FIG. 1) may program Vt2 and Vt3 data into selected memory cells simultaneously during Vt1 programming. This programming method reduces total programming time. In this embodiment, each programming pulse is assumed to increase the threshold voltage level of each memory cell by a particular ΔVt, which is less than a programming step size.

The voltage difference between programming pulses determines the widths of the Vt0, Vt1, Vt2 and Vt3 memory cell distributions in FIG. 5. For example, the smaller the difference between programming pulses, the narrower the widths of the Vt0, Vt1, Vt2 and Vt3 distributions in FIG. 5. But programming pulses with relatively small voltage differences may take a longer period of time to program memory cells compared to programming pulses with larger voltage differences.

When the memory cells selected to store Vt1 data are completely programmed and verified, the memory cells with Vt1 data will have a threshold voltage level at least higher than a Vt1 verify level ("Verify 1" in FIG. 5) and may have a distribution width close to the programming step size. These memory cells with Vt1 data are inhibited from any future programming. At this time, most of the cells selected to be programmed to Vt2 or Vt3 states have threshold voltage levels at about the threshold voltage level associated with the Vt1 state, i.e., increased from the threshold voltage level of the starting state of Vt0. In one method, the memory cells selected for Vt2 and Vt3 states are not verified or program-inhibited at the Vt1 state, which may cause problems as described below.

The memory system 100 in FIG. 1 then programs and verifies memory cells with Vt2 data, while memory cells with Vt0 and Vt1 data are program inhibited, and memory cells selected to have Vt3 data are programmed simultaneously. The memory system 100 then finishes programming memory cells selected to have Vt3 data.

Slow Bits and Fast Bits

The programming method described above is acceptable if the threshold voltage levels of the memory cells increase in parallel without too many "fast bits" or "slow bits," which are memory cells with floating gates that experience a fast or slow increase in charge and threshold voltage levels. Fast bits and slow bits may be caused by a number of factors, such as variations or imperfections in transistor fabrication, altered transistor properties due to repeated programming and erasing, etc. If there is a significant number of fast bits and/or slow bits, then the preceding method may result in over-programmed or under-programmed memory cells.

For example, when the memory system 100 (FIG. 1) programs and verifies Vt1 data, some memory cells selected to store Vt1 data will need a few extra programming pulses. These memory cells may be referred to as slow bits or under-programed cells.

In addition, memory cells selected to store Vt2 and Vt3 data are programmed simultaneously during Vt1 programming. There may be some fast bits in the Vt2 and Vt3 distributions (memory cells selected to store Vt2 data or Vt3 data) that have passed the Vt1 verify level ("Verify1" in FIG. 5) while Vt1 programming is not yet completed. Also, there may be some fast bits in the Vt3 distribution (memory cells selected to store Vt3 data) during Vt2 data programming.

FIG. 6 illustrates distributions (numbers) of memory cells in the memory array 1 in FIG. 1 or the memory array 311 in FIG. 3 that are programmed to a plurality of threshold voltage storage states, including fast (over-programmed) bits in the Vt2 and Vt3 state distributions 600. As shown in FIG. 6, the fast bits in the Vt2 and Vt3 distributions 600 are not verified and locked out (program inhibited) during Vt1 verify. Thus, the fast bits in the Vt2 and Vt3 distributions 600 will receive additional programming pulses needed to complete Vt1 programming. The fast bits in the Vt2 and Vt3 distributions 600 could potentially move too fast and reach a Vt3 verify level ("Verify3" in FIG. 6) after Vt1 programming is completed. At this time, there is no way to recover fast bits in the Vt2 distribution.

In one embodiment, it is also desirable for multi-level memory cells to have states with tight distributions to reduce the highest voltage applied during a READ operation and minimize an amount of cell coupling or the Yupin effect described in U.S. patent application Ser. No. 09/893,277, which has been incorporated by reference.

If the number of storage states per charge storage element increases, for example from four to eight, the programming time will usually increase since the smaller voltage ranges for the individual states require a greater precision of programming. The increased programming time may have a significant adverse impact on the performance of the memory system.

A Programming and Lockout Method

The objectives and problems described above are addressed by the methods described below with reference to FIGS. 7–12B. Although the methods described below refer to the system 100 in FIG. 1, the methods may be performed by the system 300 in FIG. 3. The methods described below may be performed for any type of memory array, such as NAND or NOR-type cell arrays.

FIG. 7 illustrates one embodiment of a method of programming, verifying and locking out a plurality of memory cells in the memory array 1 of FIG. 1 or the memory array 311 in FIG. 3. In a block 700 of FIG. 7, the controller 20 in FIG. 1 receives a mixed data pattern, which corresponds to multiple states such as Vt0, Vt1, Vt2 and Vt3, to be written to one or more pages of memory cells in the memory array 1. The system 100 (FIG. 1) inhibits programming of all memory cells selected to be in a Vt0 state in the memory page(s). The system 100 simultaneously programs all memory cells selected to store Vt1 data, all memory cells selected to store Vt2 data and all memory cells selected to store Vt3 data with programming pulses in a block 700.

In a block 702, after one or more programming pulses, the system 100 (FIG. 1) performs a verify operation by applying a read voltage condition to the programmed memory cells in the page(s) and determining whether any programmed the Vt1 state. The "Verify1" voltage in FIG. 9 may be set at the minimum threshold voltage 902 or offset by a small margin to account for non-ideal sensing conditions, such as noise. There are several ways to verify the programming of a memory cell, such as monitoring a current or voltage level, which are known to those of ordinary skill in the art.

This Vt1 verify operation is performed on all memory cells in the memory block(s) selected to store Vt1, Vt2 or Vt3 data. Thus, memory cells selected to store Vt2 or Vt3 data are programmed and verified at the Vt1 state with the "Verify1" voltage simultaneously with memory cells selected to store Vt1 data. If no programmed memory cells have reached the Vt1 state, the system 100 returns to block 700. If one or more programmed memory cells have reached the Vt1 state, the system 100 proceeds to block 704.

In a block 704 (FIG. 7), the system 100 (FIG. 1) locks out or inhibits the programming of each memory cell that has reached the Vt1 state for the rest of the Vt1 programming process. The lock out or program inhibit prevents fast Vt2 and Vt3 bits from being over-programmed as in the Vt2 and Vt3 memory cell distributions 600 in FIG. 6.

FIG. 9 illustrates distributions (numbers) of memory cells in the memory array 1 in FIG. 1 or the memory array 311 in FIG. 3 that are programmed to a threshold voltage Vt1 storage state with no over-programmed memory cells.

In a block 706, the system 100 performs a verify operation to determine whether all memory cells selected to store Vt1 data have reached the Vt1 state with a Verify1 voltage (FIG. 9). If at least one memory cell selected to store Vt1 data has not reached the Vt1 state, the system 100 returns to block 700. Otherwise, the system proceeds to either block 708 in FIG. 7 or block 800 in FIG. 8.

In a block 708, all memory cells selected to store Vt1 data have reached the Vt1 state. The system 708 performs a verify operation to determine whether all memory cells selected to store Vt2 data or Vt3 data have reached the Vt1 state. If the memory cells selected to store Vt2 data or Vt3 data have not all reached the Vt1 state, the system 100 repeats blocks 700–704 for the memory cells selected to store Vt2 data or Vt3 data and returns to block 708.

If the memory cells selected to store Vt2 data or Vt3 data have all reached the Vt1 state, the system 100 continues programming and verifying the memory cells selected to store Vt2 data or Vt3 data in a process similar to the process in blocks 700–706. Specifically, the system 100 programs all memory cells selected to store Vt2 data and all memory cells selected to store Vt3 data with programming pulses.

After one or more pulses, the system 100 performs a verify operation to determine whether any memory cell has reached the Vt2 state. The system 100 locks out or inhibits the programming of each memory cell that has reached the Vt2 state for the rest of the Vt2 programming process. The system 100 performs a verify operation to determine whether all memory cells selected to store Vt2 data have reached the Vt2 state with the Verify2 voltage (FIG. 10). If at least one memory cell selected to store Vt2 data has not reached the Vt2 state, the system. 100 continues Vt2 programming. Otherwise, the system proceeds with Vt3 programming.

FIG. 10 illustrates distributions (numbers) of memory cells in the memory array 1 in FIG. 1 or the memory array 311 in FIG. 3 that are programmed to threshold voltage Vt1 and Vt2 storage states with no over-programmed bits.

FIG. 11 illustrates distributions (numbers) of memory cells in the memory array 1 in FIG. 1 or the memory array 311 in FIG. 3 that are programmed to threshold voltage Vt1, Vt2 and Vt3 storage states with no over-programmed bits.

The method described above with reference to FIGS. 7–11 allows memory cells selected to store Vt2 data to start the Vt2 programming/verifying process with a tight (narrow) memory cell distribution and results in a Vt2 distribution shown in FIG. 10. Similarly, memory cells selected to store Vt3 data will start the Vt2 and Vt3 programming/verifying processes with a tight (narrow) memory cell distribution and result in a Vt3 distribution shown in FIG. 11.

Another Programming and Lockout Method

FIG. 8 illustrates another embodiment of a method of programming, verifying and locking out a plurality of memory cells in the memory array 1 of FIG. 1 or the memory array 311 in FIG. 3. At the start of the method in FIG. 8, the system 100 of FIG. 1 has programmed and verified all memory cells selected to store Vt1 data, according to blocks 700–706 in FIG. 7 and shown in FIG. 9.

In a block 800, the system 100 performs a verify operation to determine whether any memory cell selected to store Vt2 data has reached the Vt2 state with a Verify2 voltage in FIG. 10. If one or more memory cells selected to store Vt2 data have reached the Vt2 state, the system 100 proceeds to block 802.

In a block 802, the system 100 locks out or inhibits the programming of each memory cell that has reached the Vt2 state for the rest of the Vt2 programming process. The system 100 proceeds to a block 806.

If none of the memory cells selected to store Vt2 data have reached the Vt2 state (block 800), the system 100 programs the memory cells selected to store Vt2 data with programming pulses in a block 804. After one or more programming pulses, the system returns to block 800.

In block 806, the system 100 performs a verify operation with the Verify2 voltage to determine whether all memory cells selected to store Vt2 data have reached the Vt2 state. If one or more memory cells selected to store Vt2 data have not reached Vt2 state, the system 100 returns to block 804 and continues programming. If all memory cells selected to store Vt2 data have reached the Vt2 state, the system 100 has successfully locked out fast bits in the Vt2 and Vt3 distributions and achieved a memory cell distribution similar to the distribution shown in FIG. 10.

In a block 808, the system 100 performs a verify operation with a Verify3 voltage in FIG. 10 to determine whether any memory cell selected to store Vt3 data has reached the Vt3 state. In a block 810, the system 100 locks out or inhibits programming of each memory cell that has reached the Vt3 state for the rest of the Vt3 programming process. The system 100 then continues programming memory cells selected to store Vt3 data that have not been locked out and verifying the level of programming.

Thus, the method of FIG. 8 completely locks all fast bits in the Vt2 and Vt3 distributions to achieve memory cell distributions similar to FIG. 11. Any slow bits (memory cells with slow programming) selected to store Vt2 or Vt3 data that do not pass the Vt1 verify process (blocks 700–706 in FIG. 7) will be programmed and verified at the Vt2 state with Verify2 voltage, as shown in blocks 800–806 in FIG. 8. Thus, slow bits selected to store Vt2 or Vt3 data do not cause a problem.

The programming sequences for state transitions in FIGS. 7 and 8 described above may be applied to any state transition sequence, as long as there are more than two states being simultaneously programmed from one or more lower states.

The system 100 of FIG. 1 may include data latches or registers in the column control circuits 2 (or the controller 20, the command circuits 7 or the data input/output circuits 6). The data latches are configured to hold data to be written to the memory array 1 and data read from the memory array 1. Examples of data latches or registers and their operations are described in FIG. 7 of U.S. patent application Ser. No. 09/893,277 and in U.S. Pat. No. 6,046,935, which have been incorporated by reference.

In the method of FIG. 7 and/or the method of FIG. 8, when data latches in the system 100 are reset by Vt2 and Vt3 program data, the memory cells with Vt1 or Vt0 data will be program inhibited. Then Vt2 and Vt3 data are programmed and verified to the Vt2 state.

By using one of the methods described above, memory cells programmed to each state in FIG. 11 should have a Vt distribution width (e.g., widths 503, 595, 507, 509) less than or equal to the program step-up size. Examples of Vt distribution widths and program step-up sizes are provided in U.S. patent application Ser. No. 09/893,277 and U.S. Pat. No. 6,046,935, which have been incorporated by reference.

Upper Page and Lower Page Programming

The programming sequences in FIGS. 7 and 8 described above may be implemented in a memory system that programs memory cells with upper page and lower page programming techniques. Examples of upper page and lower page programming techniques are described in U.S. patent application Ser. No. 9/893,277 and U.S. Pat. No. 6,046,935, which have been incorporated by reference.

FIG. 12A illustrates distributions of memory cells in the memory array 100 in FIG. 1 or the memory array 311 in FIG. 3 after a first page programming process. The first page may be referred to as an "upper" page or a "lower" page. Some memory systems program a lower page first, as described in U.S. patent application Ser. No. 09/893,277 (see FIG. 10A–10B). Other memory systems program an upper page first, as described in U.S. Pat. No. 6,046,935 (see FIGS. 44B–44C). During first page programming, some memory cells may be program-inhibited at a first state 1201 in FIG. 12A, while other memory cells are programmed from the first state 1201 to a second state 1202.

FIG. 12B illustrates distributions of memory cells in the memory array 100 in FIG. 1 or the memory array 311 in FIG. 3 after a second page programming process. The second page may be referred to as an "upper" page or a "lower" page. During second page programming, the memory cells at the second state 1202 may be program-inhibited at the second state 1202 or programmed to the third state 1203. The memory cells at the first state 1201 may be program-inhibited at the first state 1201 or programmed to a third state 1203 and then programmed to a fourth state 1204. Thus, some memory cells in the first and second states 1201, 1202 are simultaneously programmed to the third state 1203.

The methods described above with reference to FIGS. 7 and 8 may be applied to the second page programming process in FIG. 12B. The programming method may verify whether any memory cell intended to reach the fourth state 1204 has been programmed from the first state 1201 to the third state 1203. If any memory cell intended to reach the fourth state 1204 has reached the third state 1203, the method may lock out/program inhibit each such memory cell until all such memory cells have reached the third state 1203. Thus, some memory cells in the first and second states 30 1201, 1202 are simultaneously programmed and verified at the third state 1203. After all memory cells intended to reach the fourth state 1204 have been verified at the third state 1203, the method may program such cells to the fourth state 1204, as shown in FIG. 12B.

The preceding method catches fast bits when memory cells at the first state 1201 are programmed to the fourth state 1204 and reduces the probability of fast bits from overshooting the fourth state distribution in FIG. 12B. In one embodiment, it is desirable to keep the distribution width of the fourth state 1204 as narrow as possible, i.e., prevent memory cells programmed to the fourth state 1204 from "overshooting," for at least two reasons. If a memory cell in an NAND array string, such as the string 210 in FIG. 2, has a threshold voltage that is higher than an acceptable level above the fourth state 1204, then neighboring memory cells may not conduct properly. Thus, the chain cannot be read or verified properly.

The programming sequences in FIGS. 7 and 8 described above may be combined with one or more programming and verifying methods described in the above-mentioned U.S. patent application Ser. No. 09/893,277 to tighten the memory cell Vt state distributions before programming and verifying memory cells with other Vt states.

The programming sequences for state transitions in FIGS. 7 and 8 described above may be modified. The above-described embodiments of the present invention are merely meant to be illustrative and not limiting. Various changes and modifications may be made without departing from the invention in its broader aspects. The appended claims encompass such changes and modifications within the spirit and scope of the invention.

What is claimed is:

1. A method of programming cells of a memory array in which cell threshold voltages represent logical states, comprising:

programming a plurality of cells that are to be programmed to a first threshold voltage or higher to the first threshold voltage and inhibiting individual cells of the plurality that reach the first threshold voltage until all cells of the plurality are at the first threshold voltage;

subsequently further programming individual cells of the plurality of cells that are to be programmed to a second threshold voltage or higher by inhibiting individual cells that reach the second threshold voltage until all cells that are to be programmed to the second threshold voltage or higher reach the second voltage; and subsequently further programming individual cells of the plurality of cells that are to be programmed to a third threshold voltage or higher.

2. The method of claim 1 wherein further programming individual cells of the plurality of cells that are to be programed to a third threshold voltage or higher includes programming individual cells to the third, a fourth and higher threshold voltage levels with cells being inhibited at the third, fourth and each higher threshold voltage until each of the plurality of cells has reached its target threshold level.

3. The method of claim 1 wherein a threshold voltage is determined by the charge stored in a floating gate of a cell.

4. The method of claim 3 wherein in an unprogrammed state the floating gate has no charge and the cell has a fourth threshold voltage.

5. The method of claim 4 wherein the first threshold voltage represents a first logical state, the second threshold voltage represents a second logical state, the third threshold voltage represents a third logical state and the fourth threshold voltage represents a fourth logical state.

6. The method of claim 5 wherein the first and fourth logical states represent a bit of data of a first page and the second and third logical states represent a bit of data of a second logical page.

7. The method of claim 1 wherein programming includes applying an electrical pulse to a memory cell and verifying the threshold voltage of the cell one or more times.

8. A method of programming floating gates of a memory array to charge levels that correspond to logical states, comprising:

charging a first, a second and a third floating gate together to a first charge level by inhibiting a floating gate that reaches the first charge level until the first, second and third floating gates are all at the first charge level;

subsequently charging the second and the third floating gates to a second charge level by inhibiting a floating gate that reaches the second charge level until the second and third floating gates are both at the second charge level;

subsequently charging the third floating gate to the third charge level.

9. The method of claim 8 further comprising inhibiting charging of the first floating gate once the first floating gate reaches the first charge level.

10. The method of claim 8 further comprising inhibiting charging of the second floating gate once the second floating gate reaches the second charge level.

11. The method of claim 8 further comprising inhibiting a fourth floating gate in an unprogrammed condition while charging the first, second and third floating gates.

12. The method of claim 8 further comprising charging a fourth floating gate from an unprogrammed condition to the second charge level simultaneously with programming the first floating gate from the first charge level to the second charge level.

13. A memory device that stores data in cells of a memory array where the threshold voltages of cells signify logical states, comprising:

a first plurality of memory cells to be programmed to a first threshold voltage;

a second plurality of memory cells to be programmed to a second threshold voltage;

a third plurality of memory cells to be programmed to a third voltage; and a programming circuit that programs the first, second and third pluralities of cells to the first threshold voltage and inhibits programming of individual ones of the first, second and third pluralities of cells that reach the first threshold voltage until all cells of the first, second and third pluralities of cells reach the first threshold voltage and subsequently further programs the second and third pluralities of cells to the second threshold voltage and inhibits programming of individual ones of the second and third pluralities of cells that reach the second threshold voltage until all cells of the second and third pluralities reach the second threshold voltage and subsequently further programs the third plurality of cells to the third threshold voltage.

14. The memory device of claim 13 further comprising an interface that connects the memory device to a socket in a host.

15. The memory device of claim 13 wherein the memory array comprises a plurality of strings of memory cells, a string having select gates.

16. The memory device of claim 13 wherein the memory array is a NAND flash memory array.

17. The memory device of claim 13 wherein the memory array is formed on a first integrated circuit chip and the programming circuit is formed on a second integrated circuit chip.

18. The memory device of claim 13 wherein the first, second and third pluralities of memory cells are connected by a common wordline.

* * * * *